United States Patent
Day

(10) Patent No.: US 11,456,700 B1
(45) Date of Patent: Sep. 27, 2022

(54) SPECIFYING SC AND IT CUT QUARTZ RESONATORS FOR OPTIMAL TEMPERATURE COMPENSATED OSCILLATOR PERFORMANCE

(71) Applicant: Rockwell Collins, Inc., Cedar Rapids, IA (US)

(72) Inventor: John Day, Iowa City, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/407,665

(22) Filed: Aug. 20, 2021

(51) Int. Cl.

| | | |
|---|---|---|
| H03B 5/04 | (2006.01) | |
| H03B 5/32 | (2006.01) | |
| H01L 23/00 | (2006.01) | |
| H03H 9/205 | (2006.01) | |
| H01L 27/20 | (2006.01) | |
| H03L 7/099 | (2006.01) | |
| H03L 7/085 | (2006.01) | |

(52) U.S. Cl.
CPC ............... *H03B 5/04* (2013.01); *H01L 24/16* (2013.01); *H01L 27/20* (2013.01); *H03B 5/32* (2013.01); *H03H 9/205* (2013.01); *H03L 7/085* (2013.01); *H03L 7/0991* (2013.01)

(58) Field of Classification Search
CPC .. H03B 5/32; H03B 5/04; H01L 27/20; H01L 24/16; H03L 7/085; H03L 7/0991; H03H 9/205; H04B 1/40

USPC ..... 331/2, 46, 158, 176, 116 R; 455/76, 260
See application file for complete search history.

(56) References Cited

U.S. PATENT DOCUMENTS

| | | | |
|---|---|---|---|
| 4,542,355 A | 9/1985 | Ballato | |
| 4,701,661 A | 10/1987 | Warner et al. | |
| 4,906,944 A | 3/1990 | Frerking | |
| 6,542,044 B1 | 4/2003 | Berquist et al. | |
| 6,710,663 B1 | 3/2004 | Berquist | |
| 6,831,525 B1 * | 12/2004 | Beaudin | H03L 1/00 331/46 |
| 7,011,887 B2 | 3/2006 | Obara et al. | |
| 7,705,524 B2 | 4/2010 | Onoe et al. | |
| 10,802,156 B2 | 10/2020 | Digrazia et al. | |
| 2008/0061898 A1 | 3/2008 | Soga et al. | |

FOREIGN PATENT DOCUMENTS

JP    1988067364 B2    12/1988

* cited by examiner

*Primary Examiner* — Arnold M Kinkead
(74) *Attorney, Agent, or Firm* — Suiter Swantz pc llo

(57) ABSTRACT

An oscillator includes dual resonators mounted in a helium filled coldweld holder. One resonator operates at anti-resonance into a load capacitance of about 20 picofarads, and operates on a third overtone frequency under noncontrolled temperature conditions. The other resonator operates on a fundamental mode at anti-resonance in a load capacitance of about 32 picofarads. Resonator crystals in a dual-crystal resonator may include a theta-angle shift to equalize frequency versus temperature curves at temperature extremes.

17 Claims, 5 Drawing Sheets

SPECIFYING SC AND IT CUT QUARTZ RESONATORS FOR OPTIMAL TEMPERATURE COMPENSATED OSCILLATOR PERFORMANCE

BACKGROUND

Crystal oscillators utilize mechanical resonance of piezoelectric crystals to create electrical signals with constant frequency. The frequency response of existing crystal oscillators is especially susceptible to temperature fluctuations. Production yields of various time-compensated crystal oscillators (TCCOs) are often inconsistent and low.

TCCOs have been challenging with respect to frequency versus temperature stability, including frequency stability due to shock, vibration, aging, etc. Existing quartz resonator which are used in "ovenized" oscillators are provided a constant temperature for excellent frequency stability, though require substantial power and warm-up time. Comparatively, quartz resonators used in low-power non-ovenized electrically temperature-compensated oscillators have significant thermal challenges to overcome to optimize frequency stability.

In ovenized crystal oscillators (OCXOs), due to the desire for the peak in the frequency/dynamic temperature curve ("S-curve") to be adjusted for a high temperature (slightly above the oscillator's peak operating temperature), the cold region of the S-curve suffers extreme slope which is difficult to compensate for when utilizing a separate temperature sensor, resulting in thermal inaccuracies especially during temperature slew; negatively affecting frequency stability.

SUMMARY

In one aspect, embodiments of the inventive concepts disclosed herein are directed to an oscillator having dual resonators mounted in a helium filled coldweld holder. One resonator operates at anti-resonance into a load capacitance of about 20 picofarads, and operates on a third overtone frequency under noncontrolled temperature conditions. The other resonator operates on a fundamental mode at anti-resonance in a load capacitance of about 32 picofarads.

In a further aspect, resonator crystals in a dual-crystal resonator can include a theta-angle shift to equalize frequency versus temperature curves at temperature extremes.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1:
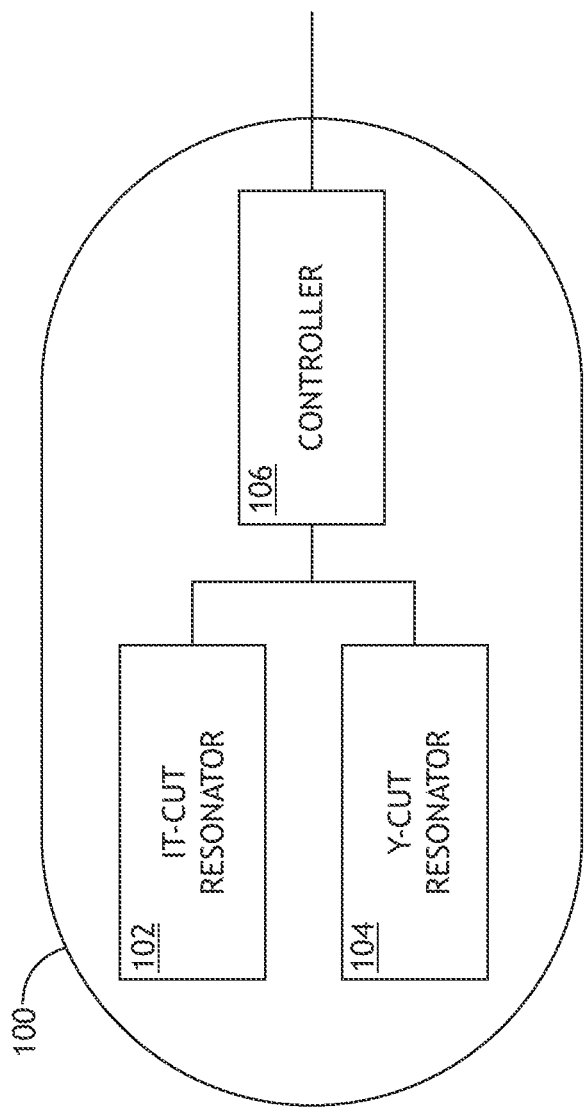
FIG. 1 shows a block diagram of an oscillator according to an exemplary embodiment.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1*a*, 1*b*). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to an oscillator having dual resonators mounted in a helium filled coldweld holder. One resonator operates at anti-resonance into a load capacitance of about 20 picofarads, and operates on a third overtone frequency under noncontrolled temperature conditions. The other resonator operates on a fundamental mode at anti-resonance in a load capacitance of about 32 picofarads. Resonator crystals in a dual-crystal resonator can include a theta-angle shift to equalize frequency versus temperature curves at temperature extremes.

Figure 3A:
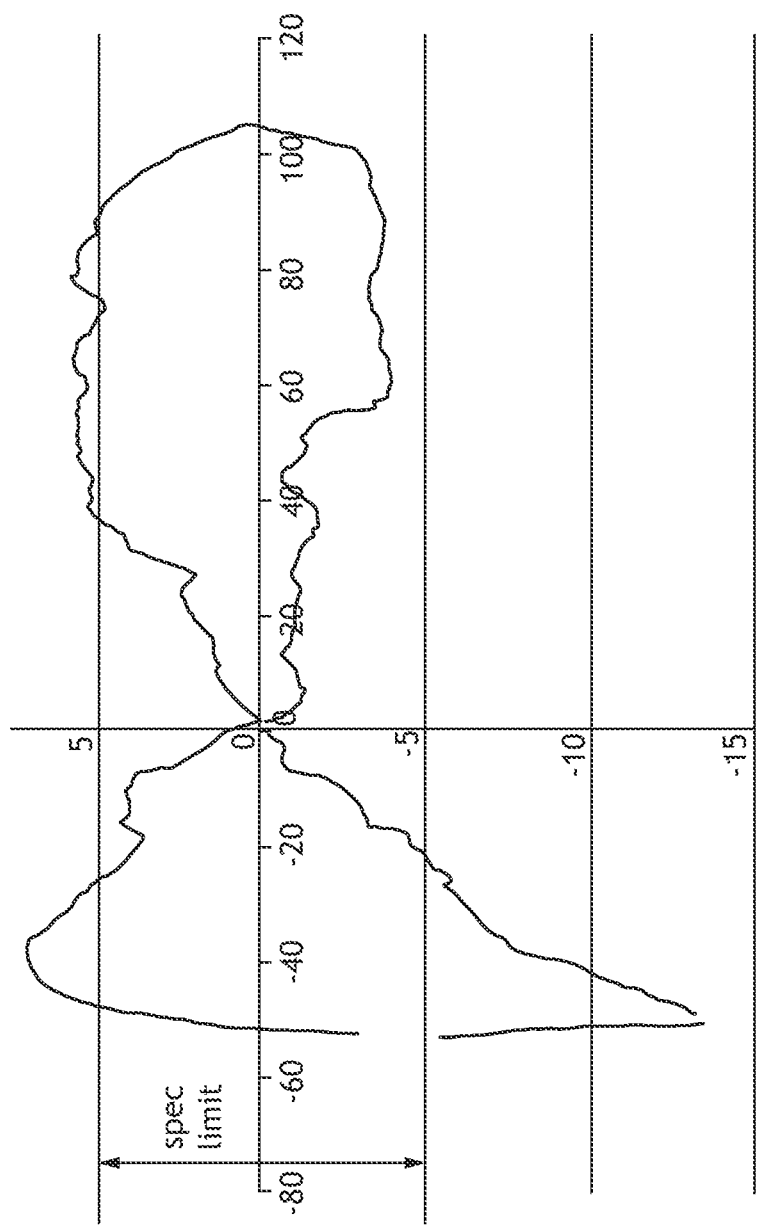
FIG. 3A shows a graph of characteristic frequency versus dynamic temperature curves.
Figure 3B:
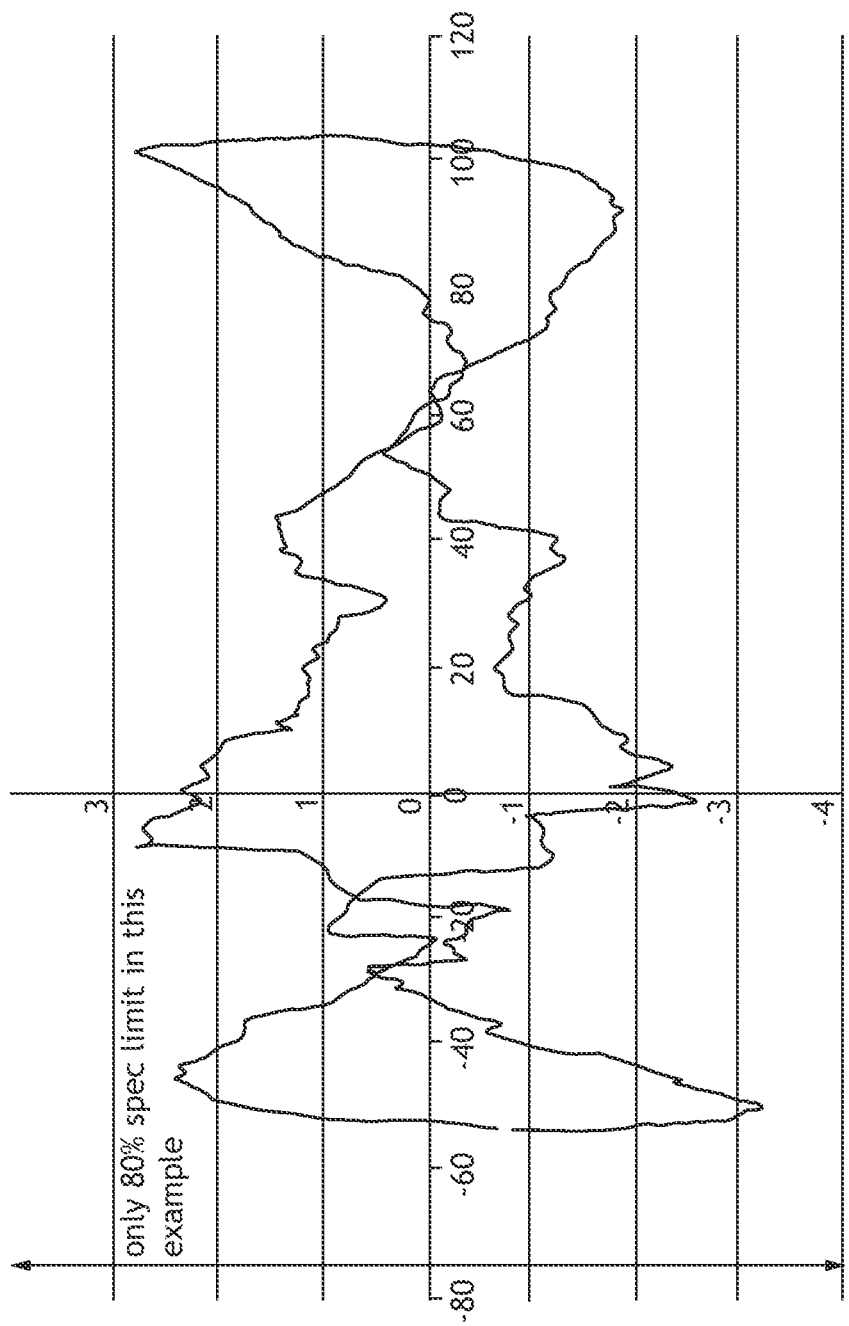
FIG. 3B shows a graph of characteristic frequency versus dynamic temperature curves.
Figure 4:
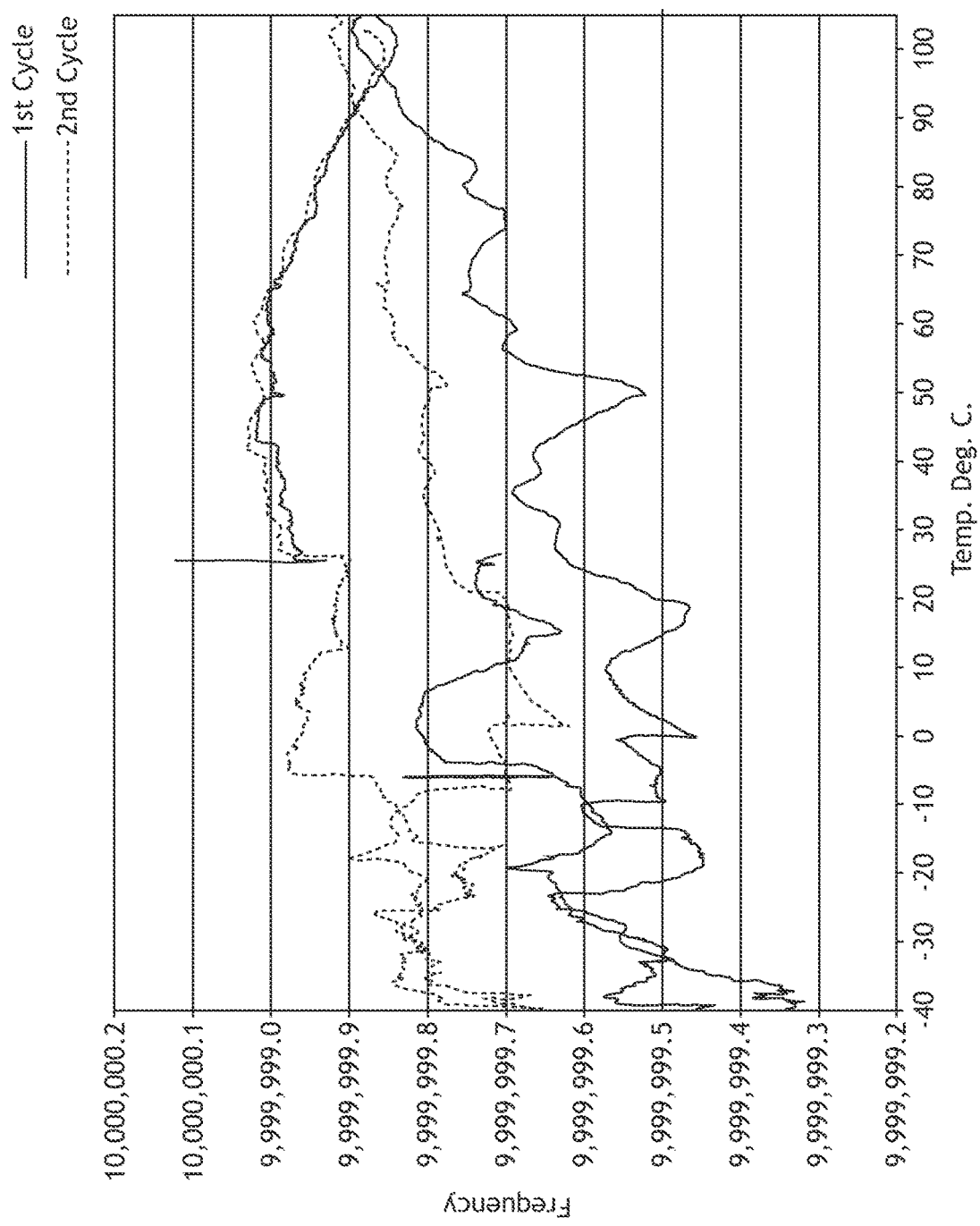
FIG. 4 shows a graph of frequency discontinuities with respect to thermal time lag.

Various TCCO designs exhibit characteristic frequency/dynamic temperature curves ("S-curves") having a "bow-tie" shaped appearance, with wider differentials near the extremes (see FIGS. 3A and 3B). The disparity is likely principally due to inherent temperature lag of the larger SC-cut resonator relative to its neighboring, smaller, temperature sensing Y-cut resonator. The smaller Y resonator follows the dual crystal package's ambient temperature more closely than does the larger thermal mass of the SC-cut resonator. Additionally, a temperature gradient can theoretically exist within the package, dependent on either calibration/verification or end-use radiant or convective thermal environments (TCCO placed very near high power transmitter components).

Referring to FIG. 1, an oscillator includes an IT-cut crystal resonator 102 and a Y-cut crystal resonator 104 configured for parallel resonance. The IT-cut crystal resonator 102 is configured at anti-resonance for a load capacitance of 20 pF (+/−0.1 pF) and the Y-cut resonator 104 is configured at anti-resonance for a load capacitance of 32 pF (+/−0.1 pF). In at least one embodiment, the IT-cut resonator 102 may be configured for a third overtone mode of vibration and the Y-cut resonator 104 may be configured for a fundamental mode of vibration.

The Y-cut resonator 104 may be configured with a temperature coefficient of 100 ppm per degree Celsius (+/−20 ppm). In at least one embodiment, the Y-cut resonator 104 may be configured with a tolerance of +/−50 kilohertz.

The IT-cut resonator 102 and Y-cut resonator 104 are configured and disposed such that the S-curve is equalized between hot and cold extremes, and minimized to the extent possible by crystal cut and mount. The temperature of the peak relative maximum of the S-curve may be arbitrary. The frequency versus temperature relationship of the IT-cut resonator 102 may be about $1*10^{-8}$ for falling temperatures.

In at least one embodiment, an oscillator includes stress compensated IT-cut and Y-cut quartz resonators 102, 104 mounted in the same helium filled coldweld holder. In at least one embodiment, the crystal resonators 102, 104 may comprise premium Q, Z growth quartz, either swept or un-swept. In at least one embodiment, resonator mass may be equalized and/or generally enlarged to reduce susceptibility to thermal fluctuation via greater thermal mass. In at least one embodiment, AT-cut resonators or SC-cut resonators may be utilized; SC-cut and IT-cut resonators have similar frequency hysteresis.

Figure 2:
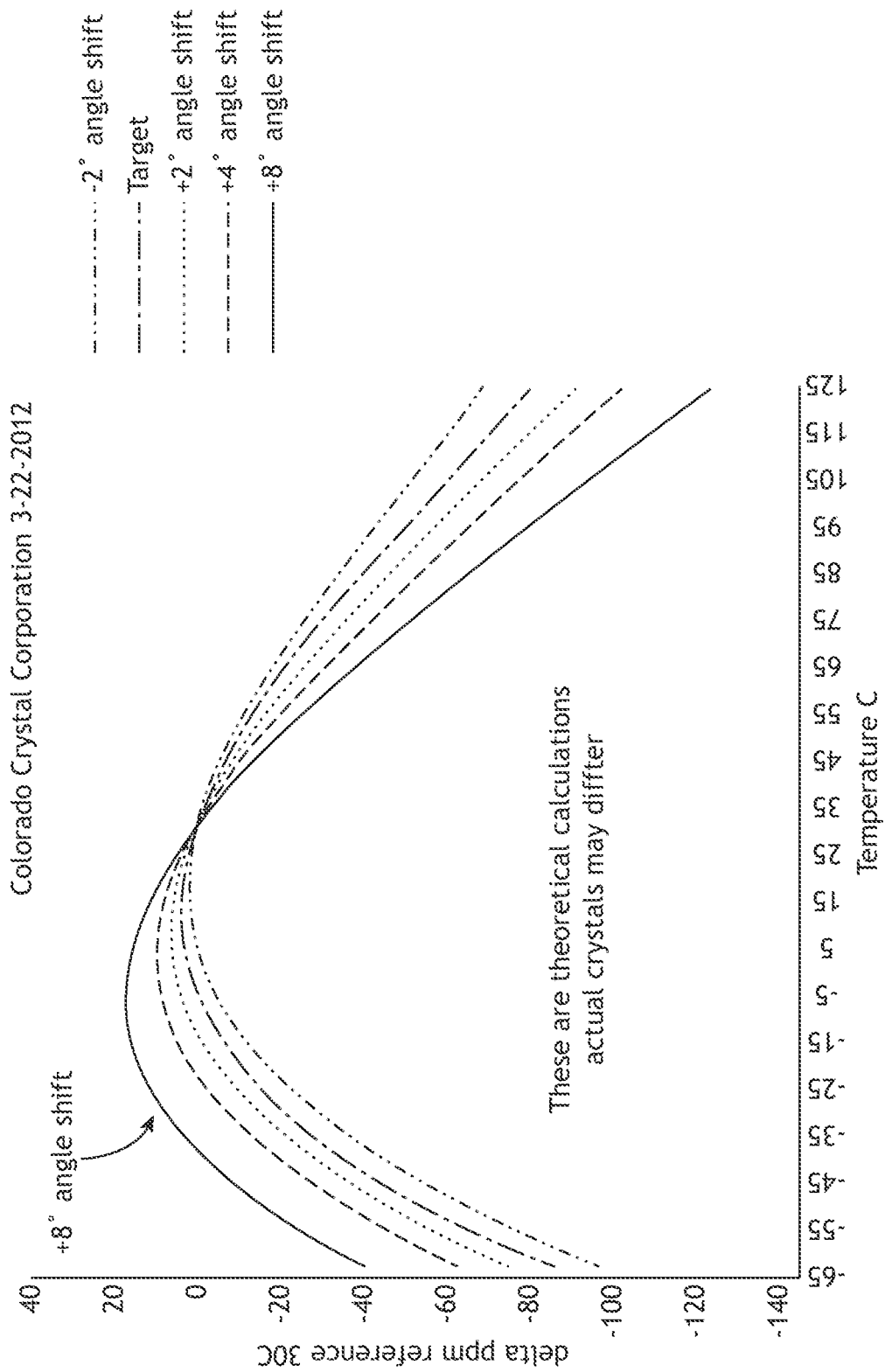
FIG. 2 shows a graph of frequency versus dynamic temperature curves at various theta-angle shift.

In at least one embodiment, an IT-cut resonator 102, with slight tweaks to angle of cut, affords both a similar balancing of temperature coefficients for cold/hot, but also an average magnitude for coefficient of frequency versus temperature inherently superior than that of an SC-cut resonator. A rotation of an SC-cut resonator by a further 10 minutes in angle adjusts the resonator's S-curve downward in temperature so as to optimize specifically the cold extreme, affording an approximately 0.5 ppm per degree C. improvement in temperature coefficient near cold. Such rotation serves to balance the S-curve toward an equality with the hot extreme's temperature coefficient magnitude. Refer to FIG. 2, frequency versus temperature performance with respect to varying theta-angles are shown.

Resonator rotation may be between four and twelve minutes of a degree with eight minutes of a degree being a target; IT-cut resonators 102 with +4 minutes of a degree further theta-angle exhibited 91% yield in calibration/verification in comparison to legacy SC-cut TCCO's approximately 50% yield.

The minimum and maximum theta-angle may be defined by IT-cut resonators 102 essential characteristics (Q, motional parameters, spurious and unwanted modes). Variant rotation mitigates the thermal mismatch which may persist between the frequency governing SC-cut or IT-cut resonator 102 and the temperature sensing Y-cut resonators 104.

In at least one embodiment, a dual crystal package for applications with frequency versus temperature stability requirements of no more than $+/-2.5*10^{-8}$ includes a controller 106 utilizing the Y-cut resonator 104 as a thermal sensor to implement a control loop. A digital controller 106 implementing a compensation schema requires frequency versus temperature repeatability. A specific, known frequency versus temperature maximum aperture does not need to be identified; likewise, it is not necessary to place the S-curve's relative maximum frequency plateau at or above the high end of the oscillator operating temperature range.

In at least one embodiment, a TCCO digital temperature compensation scheme includes a linear temperature coefficient resonator for sensing temperature fluctuations; the linear temperature coefficient resonator may be the Y-cut resonator 104. The linear temperature coefficient resonator defines a stability and repeatable temperature characteristic relationship with a co-packaged IT-cut resonator 102 (or corresponding SC-cut resonator). The controller 106 control loop controls the output of the oscillator 100. The control loop is configured to adjust frequency output with respect to temperature in a rigidly controlled manner. In at least one embodiment, such adjustment is within one degree C. per minute temperature slew.

The controller 106 is configured via mathematical curve fitting relating the Y-cut resonator 104 response to the corresponding IT-cut (or SC-cut) resonator 102, either via a defined mathematical relationship or with reference to training data. The controller 106 is configured for a consistently quick response time based on the temperature differential effects of the oscillator 100 output within a given specified operating temperature range and maximum allowable temperature slew rate initially utilized during the TCCO's programming and verification.

In at least one embodiment, the controller 106 may be configured to compare dissimilar thermal characteristics of the fundamental and third overtone of the IT-cut resonator 102 (or SC-cut resonator) and actively compensate for the disparity. Such comparison may produce stabilities near $1*10^{-9}$, eliminating the need for a dual crystal Y-cut resonator 104 where the Y-cut resonator's linear temperature coefficient functions as the temperature sensor. Alternatively, the controller 106 may monitor differing temperature characteristics of the B and C vibrational modes in IT-cunt resonator 102 (or SC-cut resonator). Utilizing either compensation strategy may mitigate at least one aspect of TCCOs ability to maintain frequency stability with aggressive temperature slew rates, though both of these methods present their own set of challenges.

Embodiments of the present disclosure mitigate radical deviation from the desired frequency at the hot and the cold extremes by equalizing the slope of the temperature versus frequency characteristic curve.

In at least one embodiment, the principal resonator (such as the IT-cut resonator) measures its own temperature, eliminating the need for the dual-crystal approach.

In at least one embodiment, immediately prior to and during package seal, the package may be maintained in a nitrogen or near vacuum environment to avoid internal humidity in the crystal package, and thereby avoid humidity related temperature instability. In at least one embodiment, a ceramic crystal package header encases the resonator instead of glass. Resonators may be IT-cut, SC-cut, and/or Y-cut quartz resonators. A ceramic header may enable significantly tighter frequency stability specifications found in ovenized crystal oscillator (OCXO) applications.

Embodiments of the present disclosure are useful to equalize the slope of a crystal oscillators frequency versus temperature characteristic at the hot and cold extremes of operation. Equalizing the slope makes temperature compensation relatively easy, with concomitant improvement in yield and cost.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. An oscillator comprising:
a first crystal resonator; and
a second crystal resonator,
wherein:
the first crystal resonator is configured to operate as a main oscillator at anti-resonance; and
the second crystal resonator is configured to operate as a temperature sensor at anti-resonance,
wherein the first crystal resonator's theta-angle is rotated between four and twelve minutes of a degree relative to the nominal angle optimized for an ovenized oscillator.

2. The oscillator of claim 1, wherein:
the first crystal resonator comprises an IT-cut quartz crystal main oscillator; and
the second crystal resonator comprises a Y-cut quartz resonator temperature sensor.

3. The oscillator of claim 1, further comprising a helium filled holder, wherein the first crystal resonator and second crystal resonator are disposed in the helium filled holder.

4. The oscillator of claim 1, wherein:
the first crystal resonator is configured to operate on a third overtone frequency; and
the second crystal resonator is configured to operate on a fundamental frequency.

5. The oscillator of claim 1, wherein the second crystal resonator has a temperature coefficient of one hundred parts per million per degree Celsius, plus-or-minus twenty parts per million.

6. The oscillator of claim 1, wherein the first crystal resonator and second crystal resonator are configured to mitigate deviation from a desired frequency at hot and cold extremes of operation by equalizing a slope of a temperature versus frequency characteristic curve.

7. A computer apparatus comprising:
an oscillator having a first crystal resonator and a second crystal resonator,
wherein:
the first crystal resonator has a theta-angle modification of between an additional four and twelve minutes of a degree;
the first crystal resonator is configured to operate at anti-resonance; and
the second crystal resonator is configured to operate at anti-resonance.

8. The computer apparatus of claim 7, wherein:
the first crystal resonator comprises an IT-cut quartz crystal main oscillator; and
the second crystal resonator comprises a Y-cut quartz resonator temperature sensor.

9. The computer apparatus of claim 7, further comprising a helium filled holder, wherein the first crystal resonator and second crystal resonator are disposed in the helium filled holder.

10. The computer apparatus of claim 7, wherein:
the first crystal resonator is configured to operate on a third overtone frequency; and
the second crystal resonator is configured to operate on a fundamental frequency.

11. The computer apparatus of claim 7, wherein the second crystal resonator has a temperature coefficient of one hundred parts per million per degree Celsius, plus-or-minus twenty parts per million.

12. A radio assembly including and oscillator comprising:
an oscillator having a first crystal resonator and a second crystal resonator,
wherein:
the first crystal resonator is configured to operate at anti-resonance; and
the second crystal resonator is configured to operate at anti-resonance,
wherein the first crystal resonator's theta-angle is rotated between four and twelve minutes of a degree relative to the nominal angle optimized for an ovenized oscillator.

13. The radio assembly of claim 12, wherein:
the first crystal resonator comprises an IT-cut quartz crystal main oscillator; and
the second crystal resonator comprises a Y-cut quartz resonator temperature sensor.

14. The radio assembly of claim 12, further comprising a helium filled holder, wherein the first crystal resonator and second crystal resonator are disposed in the helium filled holder.

15. The radio assembly of claim 12, wherein:
the first crystal resonator is configured to operate on a third overtone frequency; and
the second crystal resonator is configured to operate on a fundamental frequency.

16. The radio assembly of claim 12, wherein the second crystal resonator has a temperature coefficient of one hundred parts per million per degree Celsius, plus-or-minus twenty parts per million.

17. The radio assembly of claim 12, wherein the first crystal resonator and second crystal resonator are configured to mitigate deviation from a desired frequency at hot and cold extremes of operation by equalizing a slope of a temperature versus frequency characteristic curve.

* * * * *